(12) United States Patent
Lasser et al.

(10) Patent No.: US 7,308,525 B2
(45) Date of Patent: Dec. 11, 2007

(54) METHOD OF MANAGING A MULTI-BIT CELL FLASH MEMORY WITH IMPROVED RELIABLILITY AND PERFORMANCE

(75) Inventors: Menahem Lasser, Kohav Yair (IL); Mark Murin, Kfar Saba (IL)

(73) Assignee: Sandisk IL Ltd., Kfar Saba (IL)

( * ) Notice: Subject to any disclaimer, the term of this patent is extended or adjusted under 35 U.S.C. 154(b) by 143 days.

(21) Appl. No.: 11/090,177

(22) Filed: Mar. 28, 2005

(65) Prior Publication Data

US 2006/0155919 A1 Jul. 13, 2006

Related U.S. Application Data

(60) Provisional application No. 60/642,055, filed on Jan. 10, 2005.

(51) Int. Cl.
*G11C 16/04* (2006.01)
(52) U.S. Cl. ............. 711/103; 365/185.33; 365/185.03
(58) Field of Classification Search ................ 711/103; 365/185.33, 185.03
See application file for complete search history.

(56) References Cited

U.S. PATENT DOCUMENTS

| | | | |
|---|---|---|---|
| 5,043,940 A | 8/1991 | Harari | |
| 5,404,485 A | 4/1995 | Ban | |
| 5,434,825 A | 7/1995 | Harari | |
| 5,515,317 A * | 5/1996 | Wells et al. ................. 711/100 |
| 5,541,886 A * | 7/1996 | Hasbun .................. 365/185.03 |
| 5,930,167 A * | 7/1999 | Lee et al. .............. 365/185.03 |
| 5,937,425 A | 8/1999 | Ban | |
| 6,353,553 B1 * | 3/2002 | Tamada et al. ........ 365/185.03 |
| 6,426,893 B1 | 7/2002 | Conley | |
| 6,456,528 B1 | 9/2002 | Chen | |
| 6,522,580 B2 | 2/2003 | Chen | |
| 6,643,188 B2 | 11/2003 | Tanaka | |
| 6,678,785 B2 | 1/2004 | Lasser | |
| 6,717,847 B2 * | 4/2004 | Chen ..................... 365/185.03 |
| 6,807,106 B2 * | 10/2004 | Gonzales et al. ...... 365/185.33 |
| 2003/0099134 A1 | 5/2003 | Lasser | |
| 2003/0112692 A1 * | 6/2003 | Gonzalez et al. ...... 365/230.03 |

OTHER PUBLICATIONS

U.S. Appl. No. 11/035,807, Lasser; States Encoding in Multi-Bit Flash Cells Filed Jan. 18, 2005 Priority: U.S. Appl. No. 60/553,798.

* cited by examiner

*Primary Examiner*—Donald Sparks
*Assistant Examiner*—Jesse Diller
(74) *Attorney, Agent, or Firm*—Mark M. Friedman

(57) ABSTRACT

A method of storing data by providing a flash memory device including a plurality of memory cells; each of the memory cells is capable of storing data bits. First data bits are stored into memory cells used for storing M bits per cell, the memory cells are allocated to a page of the memory. Second data bits are stored into other memory cells, the other memory cells used for storing N bits per cell are allocated to the page and upon storing of the first data bits and upon storing the second data bits, the page uses at the same time at least one of the memory cells with M bits per cell and at least one of the other memory cells with N bits per cell with N less than M.

31 Claims, 4 Drawing Sheets

METHOD OF MANAGING A MULTI-BIT CELL FLASH MEMORY WITH IMPROVED RELIABLLITY AND PERFORMANCE

CROSS REFERENCE TO RELATED APPLICATIONS

This application claims the benefit from U.S. provisional application 60/642,055 filed 10 Jan. 2005 by the present inventors.

FIELD AND BACKGROUND OF THE INVENTION

The present invention relates to flash memories and, more particularly, to a flash memory with memory cells programmed with more than one bit per cell. Particularly, the present invention includes storing in a single page of the memory more than one density (bits/cell).

Flash memory is a type of non-volatile memory. Non-volatile memory stores information on a silicon chip in a way that does not need power to maintain the information in the chip. If power to the chip is turned off, the information is retained without consuming any power. Flash memory is made in different forms including NOR flash and NAND flash. The names refer to the similarity of the interconnections between storage cells in the two types of flash memory to the well-known NOR and NAND logic circuits. A limitation of flash memory is that while flash memory can be read or programmed, for instance in NOR flash a byte or word at a time in a random access fashion, a block of memory must be erased at the same time. A block is the smallest chunk of memory that is erased in one operation. In NAND flash memory, the memory is programmed (i.e. written) in a random access fashion a page at a time. A block is typically much larger than a page in NAND flash.

To overcome this limitation and others, a Flash File System (FFS) was disclosed in U.S. Pat. No. 5,404,485, which is assigned to the assignee of the present application and is hereby incorporated by reference as if fully set forth herein. FFS provides a system of data storage and manipulation on flash devices which allows these devices to emulate magnetic disks. In the existing art, applications or operating systems interact with the flash storage subsystem not using physical addresses but rather virtual addresses. There is an intermediary layer between the software application and the physical device that provides a mapping from the virtual addresses into the physical addresses. The intermediary layer that does the mapping described above may be a software driver running on the same CPU on which the applications run. Alternatively, the intermediary layer may be embedded within a controller that controls the flash device and serves as the interface point for the main CPU of the host computer when the host computer accesses the storage. This is for example the situation in removable memory cards such as secure digital (SD) cards or multimedia cards (MMC), where the card has an on-board controller running a firmware program that among other functions, implements the type of mapping described above.

Software or firmware implementations doing such address mappings are typically called "flash management systems" or "flash file systems". The latter term is a misnomer, as the implementations do not necessarily support "files", in the sense that files are used in operating systems or personal computers, but rather support block device interfaces similar to those exported by hard disk software drivers. Still, the term is commonly used, and "flash file system" and "flash management system" are used herein interchangeably.

For NAND-type flash devices, the mapping is done as follows, referring to FIG. 1 (prior art): Physical address space 13 is composed of units 111 that are actually the erase blocks i.e. the smallest chunks that can be erased. The terms "block" and "erase block" are used herein interchangeably. Each physical unit 111 contains one or more physical pages 113, where a "page" is the smallest chunk that can be written. A virtual address space 11 is composed of virtual units 121 that have the same size as the physical units. Each virtual unit contains one or more virtual pages 123, having the same size as physical pages 113. When a virtual address is provided by an application, for reading or writing, the virtual unit number to which that address belongs is extracted from the virtual address. There is a mapping that assigns to each virtual unit 121 either one physical unit 111 or a chain of more than one physical unit 111. Then physical page 113 corresponding to requested virtual page 123 within virtual unit 121 is located within the corresponding physical unit(s) 111, using a "local" mapping rule that relates virtual pages 123 to physical pages 113, or using control information stored with physical pages 113.

Typically, each memory cell within a flash memory stores one bit of information. The traditional way to store a bit in a flash memory cell has been by supporting two states of the cell. One state represents a logical "0" and the other state represents a logical "1". In a flash memory cell, the two states are implemented by having a floating gate above the cell's channel (the area connecting the source and drain elements of the cell's transistor), and having two valid states for the amount of charge stored within the floating gate. Typically, one state is with zero charge in the floating gate and is the unwritten state of the cell after being erased (commonly defined to represent the "1" state) and the other state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. It is possible to read the stored bit by checking the threshold voltage of the cell. If the threshold voltage is in the higher state then the bit value is "0" and if the threshold voltage is in the lower state then the bit value is "1". Actually there is no need to accurately read the cell's threshold voltage. All that is needed is to correctly identify in which of the two states the cell is currently located. For this purpose it is sufficient to compare the threshold voltage of the cell to a reference voltage that is between the two states, and to determine if the cell's threshold voltage is below or above the reference value.

FIG. 1A (prior art) shows graphically how this works. Specifically, FIG. 1A shows a distribution of the threshold voltages of a large population of cells. Because the cells in a flash device are not exactly identical in their characteristics and behavior (due to, for example, small variations in impurity concentrations or defects in the silicon structure), applying the same programming operation to all the cells does not cause all the cells to have exactly the same threshold voltage. Instead, the threshold voltage is distributed as shown in FIG. 1A. Cells storing a value of "1" typically have a negative threshold voltage, such that most of the cells have a threshold voltage close to the central voltage value of the left peak (labeled 1) of FIG. 1A, with fewer cells having threshold voltages lower or higher than the central voltage of the left peak. Similarly, cells storing a value of "0" typically have a positive threshold voltage, such that most of the cells have a threshold voltage close to the central voltage of the right peak (labeled 0) of FIG. 1A, with fewer cells having threshold voltages lower or higher than the central voltage of the right peak. In recent years, a new kind of flash device has appeared on the market, using "Multi Level Cells" (MLC). The term "Multi-Level Cell" is misleading because flash memory with a single bit per cell uses multiple i.e. two levels, as described above. Therefore, the term "Single Bit Cell" (SBC) is used hereinafter to refer to a memory cell of two levels and the term "Multi-Bit Cell" (MBC) is used hereinafter to refer to a memory cell of more than two levels, i.e. more than one bit per cell. A representative prior art example of an MBC flash device is found in U.S. Pat. No. 5,434,825 disclosed by Harari. The present discussion is directed primarily to an MBC flash memory with two bits per cell. It should however be understood that the present invention is equally applicable to flash memory devices that support more than two bits per cell.

A single MBC cell storing two bits of information is in one of four different states. As the cell's "state" is represented by the cell's threshold voltage, an MBC cell supports four different valid ranges for the cell's threshold voltage. FIG. 1B (prior art) shows the threshold voltage distribution for a typical MBC cell of two bits per cell. As expected, FIG. 1B has four peaks, each peak corresponding to one state. As for the SBC, each state is actually a voltage range and not a single voltage. When reading the cell's contents, the cell's threshold voltage must be correctly identified in a definite voltage range.

In most MBC devices the device manufacturer does not give the user any means to select the number of bits per cell in a given block, i.e the number of bits per cell is the same for all the cells in the device. However, in some MBC devices the number of bits per cell can be reduced on parts of a device in order to achieve higher performance or higher reliability during programming. For example, a MBC flash may store two bits per cell in most of its blocks, but under software program control, store only one bit per cell in other blocks. MBC flash devices having different blocks within the same device storing different numbers of bits per cell have been disclosed in prior art. Representative prior art includes Lee et al. U.S. Pat. No. 5,930,167, Gonzales et al. U.S. Pat. No. 6,807,106, and Chen U.S. Pat. Nos. 6,456,528 and 6,717,847. Chen discloses switching blocks to a lower number of bits per cell when the blocks approach the end of their expected useful lifetime.

In MBC devices, the different peaks of the threshold voltage distribution graph are used for encoding the values of the bits stored in the cell. We shall use the notation and terminology of Lasser U.S. Patent Application 60/553,798 entitled "States encoding in multi-level cell flash memory" ("Lasser '798"), incorporated by reference for all purposes as if fully set forth herein. Referring to FIG. 1B, showing the threshold voltage distributions of an MBC cell. The graph's peaks are labeled (from left to right) "11", "10", "00", "01". This means that When a cell is in state A, (the first state from the left), it represents a "1" for the lower bit and a "1" for the upper bit, (this is the initial un-programmed state of the cell)

When a cell is in state B (the second state from the left), it represents a "0" for the lower bit and a "1" for the upper bit.

When a cell is in state C (the third state from the left), it represents a "0" for the lower bit and a "0" for the upper bit.

When a cell is in state D (the fourth state from the left), it represents a "1" for the lower bit and a "0" for the upper bit.

The encoding scheme presented above for a two-bit-per-cell MBC is the one proposed by Chen in U.S. Pat. No. 6,522,580. A different scheme is proposed by Tanaka U.S. Pat. No. 6,643,188, where the order of the bit assignments (from left to right along the threshold voltage axis) is: "11", "10", "01", "00". The interpretation of this scheme is:

When a cell is in state A (the first state from the left), it represents a "1" for the lower bit and a "1" for the upper bit, (this is the initial un-programmed state of the cell).

When a cell is in the state B (second state from the left), it represents a "0" for the lower bit and a "1" for the upper bit.

When a cell is in state C (the third state from the left), it represents a "1" for the lower bit and a "0" for the upper bit.

When a cell is in state D (the fourth state from the left), it represents a "0" for the lower bit and a "0" for the upper bit.

A cell designed for MBC operation e.g. in four states is typically operable as an SBC cell with two states. For example, Conley et al. in U.S. Pat. No. 6,426,893 incorporated by reference for all purposes as if fully set forth herein, disclosed using both MBC and SBC modes within the same device, selecting certain parts of the device to operate with highest density in MBC mode, while other parts are used in SBC mode to provide better performance.

MBC devices provide a significant cost advantage. An MBC device with two bits per cell requires about half the area of a silicon wafer than an SBC of similar capacity. However, there are drawbacks to using MBC flash. Average read and write times of MBC memories are longer than of SBC memories, resulting in worse performance. Also, the reliability of MBC is lower than SBC. The difference between the threshold voltage ranges in MBC are much smaller than in SBC. Thus, a disturbance in the threshold voltage (e.g. leakage of stored charge causing a threshold voltage drift or interference from operating neighboring cells) that are insignificant in SBC because of the large gap between the two states, may cause an MBC cell to move from one state to another, resulting in an erroneous bit. The end result is a lower performance specification of MBC cells in terms of data retention time or the endurance of the device to many write/erase cycles.

Let us now consider the way flash management software works. The following explanation is for NAND-type flash devices, but this is not meant to limit the invention in any way. The host processor to which the flash storage system is attached interacts with it by reading and writing data sectors (also called "user data" herein), typically the size of 512 bytes. On the physical flash devices each sector is stored in page 113 (typically also 512 bytes, but there are also devices with other page sizes), which is the minimal chunk of data for writing operations. A sector often refers to the data stored in page 113. The term "sector" and the term "page" are used herein interchangeably.

For correct and efficient operation the flash management software must keep certain control information for each and every sector. For example, a sector can be accompanied by flags indicating whether it currently contains valid data, whether it is free to be used (without having to be erased before that), etc. Additionally, there is a need to keep information identifying the address mapping associated with a sector, for example where is this sector located in the logical or virtual address space by which the host interacts with the storage system. Some control information may be associated not with a single sector but with the whole group of sectors stored in the same block (a block is the minimal chunk of data for erase operations). An example for this is the storage of "erase marks" indicating that the block containing them had completed a valid erase operation and may be reliably used for writing data, as taught by Lasser et al. U.S. patent application Ser. No. 10/298,094 entitled "Detecting partially erased units in flash devices". This type of block-related information is typically kept in the first sector of the block, accompanying the data stored in that sector. Flash management systems operating according to these principles are very well known in the art. See for example Lasser U.S. Pat. No. 6,678,785 entitled "Flash management system using only sequential write", and Ban U.S. Pat. No. 5,937,425 entitled "Flash file system optimized for page-mode flash technologies", which patents are incorporated by reference for all purposes as if fully set forth herein. Because of the common need to store additional information associated with a data sector, NAND flash devices are built with an additional amount of storage space associated with each sector (called "extra area" or "spare area"), providing the flash management software with room to store control information. Typically such devices provide 16 bytes of extra area per each 512 bytes of regular storage space.

The control information described above is used by the flash management software as input for management algorithms. Therefore, the control information is critical to the correct operation of the flash system. While an error in the user data does not damage the flash management system, an error in the control information might result in the loss of a whole sector, a whole block, or (in extreme cases) even the whole disk contents. Hence, there is great importance in being able to read the control information with the highest reliability.

Also because the control information described above is used by the flash management software as input for its management algorithms, control information is accessed quite frequently, on the average more frequently than the associated user data. For example, when mounting the flash storage device (that is—when initializing the flash management software after system power up), the control information of many sectors must be read in order to construct and initialize the address translation tables of the software, even though no user data is actually read at that time. Also during normal operation, there are many cases where in order to locate a data sector requested by the host, we must read the control information of quite a few sectors in order to locate the requested one. Therefore there is great performance advantage in being able to read the control information (without the user data in the associated sector) as fast as possible.

In all prior art flash systems using the above methods the control information is stored using the same writing modes as the regular user data. If the flash device uses MBC mode, then both user data and control information are stored in MBC mode. And if the flash device uses SBC mode, then both user data and control information are stored in SBC mode. So both user data and control information have the same reliability and the same reading speed.

Prior art flash memory systems do not support separating "modes" between user data and control information. Control information is stored in the same page as the related user data and in many cases the control information is being stored together with the user data in the same write operation. Prior art flash devices do not support a single writing operation which writes some memory cells using MBC mode and other memory cells using SBC mode, because much of the internal circuitry of the flash device which carries out the writing operation is shared between all the cells being written together, and the prior art circuitry cannot act at the same time in two different modes. Secondly, the flash device must be instructed (by the controller of the flash system) in which mode, MBC or SBC, the page is programmed, and the current interfaces of existing flash devices do not support mixing modes within the same basic operation.

Thus there is a need and it would be advantageous to have a method for storing control information into the flash device in the same pages with the same writing operations as the user data related to the control information.

SUMMARY OF THE INVENTION

The term "page" as used herein is the smallest portion of flash memory that can be written in a single operation.

The term "voltage state" as used herein refers to a state of a flash memory cell in which the threshold voltage of the cell is within a specified range of voltage values; the threshold voltage within the specified range indicates the storage of a specific pattern of bits. Positive and negative infinity are also considered valid voltage values for the purpose of this definition, so that a voltage state may correspond to the range of all threshold voltages below a given value or above a given value.

In the context of discussing the voltage states of a memory cell used to store N bits, the term "available voltage state" refers to a voltage state used in a single cell when storing more than N bits. The term "largest available voltage state" refers to the most extreme available voltage state, i.e. of highest voltage. The terms "right most state" and "voltage state of largest voltage" are used herein interchangeably.

According to the present invention there is provided a method of storing data by providing a flash memory device including a plurality of memory cells; each of the memory cells is capable of storing data bits. First data bits are stored into memory cells used for storing M bits per cell, the memory cells are allocated to a page of the memory. Second data bits are stored into other memory cells, the other memory cells used for storing N bits per cell are allocated to the page and upon storing the first data bits and upon storing second data bits, the page uses at the same time at least one of the memory cells with M bits per cell and at least one of the other memory cells with N bits per cell with N less than M. Preferably, the first data bits are user data bits and the second data bits are control data bits. Preferably N is one or two. Preferably, when N is one, M equals two, three or four; and when N equals two, M is three or four. Preferably, the storing of the first data bits and the second data bits is performed with a single write operation. Preferably, the method further includes reading one or more of the memory cells and the other memory cells in a single read operation, wherein the reading reads one or more of the first data bits and one or more of the second data bits. Preferably, the method includes reading the other memory cell in a single read operation, the reading reads one or more of the second data bits. Preferably, the other memory cell uses an available voltage state of largest voltage. Preferably, the other memory cell uses an available voltage state other than the voltage state of largest voltage used by the memory cells. Preferably, the other memory cells use an available voltage state of second largest voltage. Preferably, the flash memory device is a NAND flash memory device and the page is the smallest chunk of memory that can be written in a single operation.

According to the present invention there is provided a method of reading stored data by providing a flash memory device including a plurality of memory cells. Each of the memory cells is capable of storing M data bits, and M is an integer greater than one. The method further includes reading in a single command a single bit respectively from each of the memory cells of a page, wherein the single bit read from one of the memory cells is valid only when less than M bits are stored in the one memory cell.

According to the present invention there is provided a method of reading stored data by providing a flash memory device including memory cells. Each of the memory cells is capable of storing M data bits, when M is an integer greater than one; and by providing a read command for reading a group of the memory cells. The read command always performs a single voltage comparison on each memory cell of the group. Preferably M is two, three or four.

According to the present invention there is provided a flash memory device including memory cells capable of storing data bits. The device further includes a controller which stores first data bits storing M bits per cell in one or more of the memory cells and second data bits storing N bits per cell in one or more other memory cells. The memory cells are allocated to a page, and the other cells are allocated to the same page. The page uses at the same time the memory cells with M bits per cell and the other memory cells with N bits per cell, with N less than M. Preferably, the first data bits are user data bits and the second data bits are control data bits. Preferably N is one or two. Preferably, when N is one, M equals two, three or four; and when N equals two, M is three or four. Preferably, the storing of the first data bits and the second data bits is performed with a single write operation. Preferably, the method includes reading the other memory cell in a single read operation, the reading reads one or more of the second data bits. Preferably, the other memory cells use an available voltage state of largest voltage. Preferably, the other memory cells use an available voltage state other than the voltage state of largest voltage used by the memory cells. Preferably, the other memory cells use an available voltage state of second largest voltage.

According to the present invention there is provided a flash memory device including memory cells capable of storing M data bits, wherein M is an integer greater than one; and a mechanism for reading in a single command a single bit respectively from any of the memory cells of a page, wherein said single bit read from one of said memory cells is valid only when less than M bits are stored in said one memory cell. Preferably, M is two, three or four.

According to the present invention there is provided, a flash memory device including a plurality of memory cells. Each of the memory cells is capable of storing M data bits, with M an integer greater than one. The device further includes a mechanism for providing a read command for reading a group of the cells wherein the read command always performs a single voltage comparison on each memory cell of the group. Preferably, M is two, three or four.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
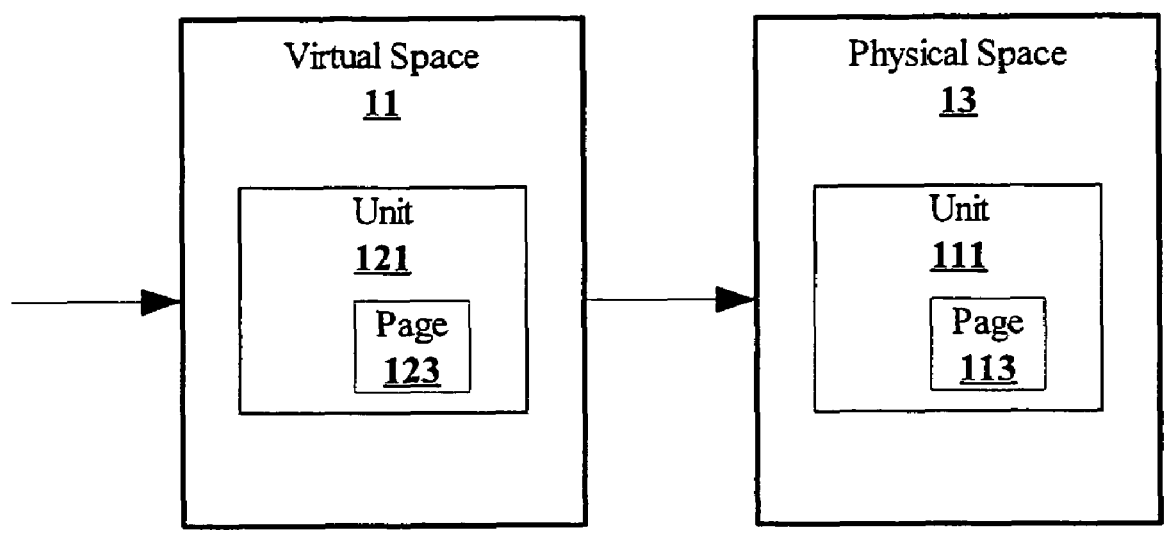
FIG. 1 (prior art) is a simplified drawing of a conventional flash device.

The present invention is of a system and method for storing control information, in the flash device in the same pages as the user data related to the control information. Specifically, the storing is performed with the same writing operations as the user data The principles and operation of a system and method for storing control information and user data in the same page, according to the present invention, may be better understood with reference to the drawings and the accompanying description.

Before explaining embodiments of the invention in detail, it is to be understood that the invention is not limited in its application to the details of design and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Embodiment 1

The first embodiment of the present invention is to write the control information and the user data using MBC mode, but still get improved reliability (but not improved read performance) similar to SBC mode. For this to be achieved we restrict the use of the memory cells used for storing the control information to storing just a single bit worth of information each, and not utilize the extra bits that can be stored in these cells when using MBC mode.

Figure 1A:
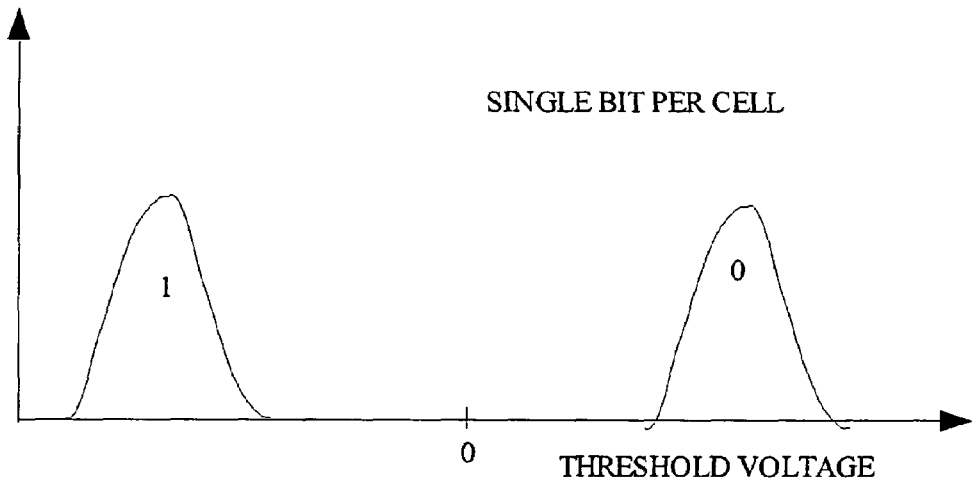
FIG. 1A is a simplified graph illustrating a threshold voltage distribution in a prior art flash device with a single bit per cell.
Figure 1B:
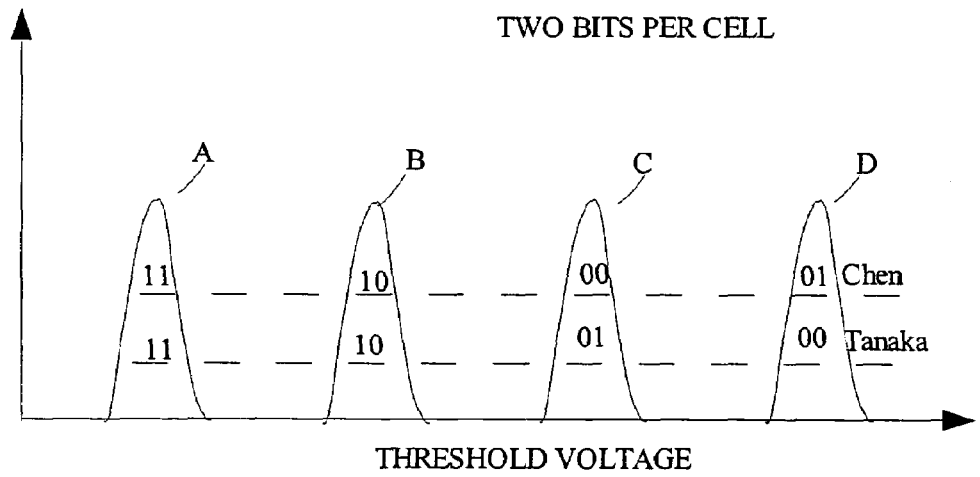
FIG. 1B is a simplified graph illustrating a threshold voltage distribution in a prior art flash device with two bits per cell.

As already explained above, the reason for lower reliability when using MBC mode compared to SBC mode, is the smaller gap between the states of the cell. Thus it is more probable for a cell to erroneously change its state and thus represent incorrect value for one or more of the stored bits. But suppose we use the same cell in a restricted way—only the states "11" and "01" are used, using the Chen coding convention. As can be seen in FIG. 1B, this is the pair of states with largest separation on the threshold voltage axis. Thus, it is highly unlikely a cell written to one of these two states will move into the other state. Actually, the separation between the two states in this case is even larger than in most SBC devices, as can be seen by comparing FIGS. 1A and 1B. We assign the left state of the two to represent a "1", and the right state of the two to represent "0". What we get is an MBC cell that can store a single bit with a much higher reliability than the reliability of bits stored in MBC cells in their normal use. Writing the values "1" or "0" into the cell so as to operate it in this high-reliability mode is done as follows:

To write a "1": write "1" into both lower and upper bits, resulting in the cell being in the left-most state.

To write a "0": write "1" into the lower bit and write "0" into the upper bit, resulting in the cell being in the right-most state.

To achieve the goal of storing the control information with a higher reliability while writing it into the same page as its related user data we do the following:

The bits of the user data are written into the memory cells utilizing the maximum capacity of the cells. If the MBC cells are capable of storing two bits per cell (as in the example above), then two user data bits are put into each cell.

The bits of the control information are written into the memory cells with only one bit stored in each cell. However, each such bit is represented by specific values of the two bits of the cell, so as to cause the resulting two states to be the furthest apart.

Both types of bits are stored into the same page, possibly using the same write operation. The writing operation uses MBC mode (typically the only write operation available in the device).

In order to read the control information we apply regular MBC read commands (typically the only read command available). After retrieving the two bits from a control information cell, we translate them into the single bit they represent according to the following rules:

If we read "11", the control information bit is taken to be "1"
If we read "10", the control information bit is taken to be "1" (even though the cell drifted into an incorrect state, we may assume its original value was "11", as this is the closer state of the original two).
If we read "00", the control information bit is taken to be "0" (even though the cell drifted into an incorrect state, we may assume its original value was "01", as this is the closer state of the original two).
If we read "01", the control information bit is taken to be "0".

The above procedure is straight-forward in the case both bits of each cell belong to the same page. In such case storing the two bits is done in one write operation which can store both user data and control information together, and reading the two bits can also be done in one read operation. However the current invention is also applicable to MBC devices where the two bits of a cell belong to two different pages. In such devices the multiple pages sharing the cell are typically adjacent to each other in the device address space. What needs to be done in such a case is for each group of pages sharing the same user data cells to assign a shared group of cells for storing their control information together, and sequentially write those pages into the device. This will operate exactly the same as in the previous case, except that in this case we do multiple write operations for filling the cells, each operation writing a single bit into the cells, and we do multiple read operations for reading the cells, each operation reading a single bit from the cells.

It should be understood that this invention is not limited to any specific encoding scheme of the bits by the cells' states. The encoding scheme presented in the example above for a two-bit-per-cell MBC is the one proposed by Chen in U.S. Pat. No. 6,522,580.

In the encoding scheme proposed by Tanaka U.S. Pat. No. 6,643,188, the two most separated states are "11" and "00", so these two states are chosen as the two states used for storing a single bit in a high reliability mode Writing the values "1" or "0" into the cell so as to operate it in this high-reliability mode is done as follows:

To write a "1"—write "1" into both lower and upper bits, resulting in the cell being in the left-most state.

To write a "0"—write "0" into both lower and upper bits, resulting in the cell being in the right-most state.

The procedure for reading will be:

If we read "11", the control information bit is taken to be "1"
If we read "10", the control information bit is taken to be "1" (even though the cell drifted into an incorrect state, we may assume its original value was "11", as this is the closer state of the original two).
If we read "01", the control information bit is taken to be "0" (even though the cell drifted into an incorrect state, we may assume its original value was "01", as this is the closer state of the original two).
If we read "00", the control information bit is taken to be "0".

Except for the change in the values of bits selected to represent a "0", all the rest of the write and read procedures operate exactly the same with both encoding schemes. We can thus see that for every valid encoding scheme we should select the two-bit value "11" to represent "1" and another two-bit value (the one assigned to the right-most state) to represent "0". Regardless of encoding scheme used by the MBC cells, this procedure will always result in highly reliable single bit storage.

The method according to an embodiment of the present invention of achieving better reliability for the control information is applicable to any standard MBC flash device (and even if it does not support SBC mode), as special commands or modes are not required in the device. A flash management software utilizing this method over an MBC flash device issues to the device only standard MBC write and read commands. The flash device is actually "not aware" it is being used in a special way. It is the software that achieves the advantage offered by this method by appropriately storing the control information with each bit allocated a separate memory cell, employing the right encoding according to the methods presented above.

While the above examples all show two-bit-per-cell MBC devices, the invention is not limited to this case and is equally applicable to MBC cells with a higher number of bits per cell. For example, a four-bit-per-cell MBC device may use an encoding scheme where the order of the bit assignments (from left to right along the threshold voltage axis) is —"1111", "1110", "1100", "1101", "1001", "1011", "1010", "1000", "0000", "0100", "0101", "0001", "0011", "0010", "0110", "0111". Here each control information bit is represented by a 4-bit value —"1111" for "1" and "0111" for "0". When reading the control information, the first 8 values in the above list are taken to represent a "1" and the last 8 values in the above list are taken to represent "0". Following these rules results in the four-bit-per-cell cells operating as highly reliable SBC cells The method can be generalized even further by storing more than one control information bit in a cell, provided the number of control information bits per cell is still lower than the number of user data bits per cell. For example, in the four-bit-per-cell MBC device discussed above, we may store two control information bits per cell. This will result in lower reliability for the control information than when only a single bit is stored per cell, but the reliability of the control information will still be higher than the reliability of the user data. This generalization is also within the scope of the present invention.

A Further Improvement: Embodiment 2

The first embodiment presented above provides for storing control information with high reliability, but does not address the need for storing control information so as to provide better read performance. A second embodiment of the present invention addresses this need too and supports both the reliability and performance goals. The second embodiment, as opposed to the first embodiment requires a special read command provided by the flash device.

This second embodiment uses the same principles as the first embodiment, also relying on storing the control information with each bit allocated a separate cell, and picking the two furthest separated states of a MBC cell for representing the single bit stored in the cell. When it comes to writing, the second embodiment of the present invention is completely identical to the first embodiment. The only difference is in how reading is done. While the first embodiment employs standard MBC-mode read commands for retrieving the control information, the second embodiment employs a special read command tailored to read cells written using the one-bit-per-cell method of the current invention.

Standard MBC mode read commands have to separate between at least four different states of a cell. Therefore, standard MBC mode read commands cannot read the contents of MBC cells by using a single threshold voltage comparison. (See Lasser '798 for a discussion of the issues related to the number of comparisons required for reading MBC cells). However, the way the methods of the current invention use the MBC cells for storing the control information allow for reading the contents of those cells using only a single comparison. As we know in advance those cells were written into either one of two states, it is possible to implement a read command that compares the cells' threshold voltage to a reference separating the two states (for example, a reference set to lie between the second and third states of a two-bit MBC or between the eighth and ninth states of a four-bit MBC). Such a read command is faster than the regular MBC-mode read commands used to read the control information in the first embodiment, as the number of comparisons is a major factor in determining the time it takes to perform the reading.

The special fast-read command of this embodiment is guaranteed to provide correct readings when applied to cells written to store one bit each according to the methods of the current invention. If this command is applied to cells written to store more than one bit per cell, only one bit value is returned from each cell and the returned value might even be meaningless. The command is designed to separate the upper half of the states from the lower half, but this information is not necessarily consistent or useful. For example, in a two-bit MBC device utilizing the encoding scheme of Chen this command will actually return the value of the upper bit stored in the cell. If that two-bit MBC device uses a scheme with states ordered (from left to right) as {"11", "01", "10", "00"} (which is shown in Lasser '798 to also be a valid scheme), then the command will return the value of the lower bit stored in the cell. In MBC cells with more than two bits per cell there are valid schemes where the returned value does not represent any of the bits stored in the cell. So in general, one cannot treat the value returned by this command from a cell used to store more than one bit as meaningful.

It should be noted that for a NAND flash device the second embodiment provides reading performance advantage only when there is a need to read the control information, but not the associated user data. In such a case we perform the read using the fast command as opposed to reading using the slower standard commands. However, when there is a need to read both user data and its associated control information together, there is no improvement in speed. As the user data has to be read anyway using the slower standard command, we get the control information at the same time, and there is no need to apply the special fast read command of the second embodiment.

An Additional Improvement: Embodiment 3

The first and second embodiments presented above provide for the reliable storage of control information by storing each control information bit in a separate cell, and choosing the right-most state of the MBC cell to represent a "0". Choosing the "right-most" state provides for the widest separation between the two valid states and therefore has the lowest probability of the cell drifting with time towards the "1" state and generating an error.

While using the "right-most" state is the best countermeasure for defending against errors caused by charge leakage from the floating gate of the cells, there is another potential source of errors known as "over programming" in NAND flash devices. For understanding the architecture of the cells array in NAND devices and the reasons for the existence of the over programming effect, one is referred to Chen et al. U.S. Pat. No. 6,522,580 entitled "Operating techniques for reducing effects of coupling between storage elements of a non-volatile memory operated in multiple data states" (see especially FIGS. 2 and 6), incorporated by reference for all purposes as if fully set forth herein.

Over programming occurs when a cell is programmed "too much". This means its threshold voltage gets higher than even the right-most state in the threshold voltage distribution graph (to the right of state "01" in FIG. 1B). Such event might happen when attempting to program a cell to the right-most state. A cell that was meant to be written to the right-most state and happened to be over programmed will actually be read correctly by the reading circuitry as it will provide the correct results in every comparison operation done during the reading process. However, because of the way flash cells are chained in NAND devices (forming long connected strings, as shown in Chen et al.), an over programmed cell results in errors in reading the other cells located on the same chain. Each of these other cells will be read as if it is in the right-most state, regardless of its actual state. This is because an over programmed cell is always in the non-conducting state (due to its very high threshold voltage), not allowing the other cells along its chain to conduct, a result that is interpreted by the reading circuitry as being in the right-most state.

Translating the above into what the user of the flash will see, an over programmed cell in one page causes all the cells located in exactly the same address in the other pages of the same block and storing control information to be read as "0". As the methods of the previous embodiments store a control information bit having a value of "0" by programming its cell to the right-most state, those embodiments are actually increasing the probability of errors caused by over programming because they write a large portion of the cells storing control information into the "risky" right-most state. Typically, the control information cells are located in the same addresses in every page, so control information cells are typically on the same chains with other control information cells. Therefore, increasing the probability of over programming in a control information cell, increases the probability of other control information cells (in neighboring pages) to be read incorrectly.

The third embodiment of the present invention significantly reduces the risks of over programming by modifying the methods of the previous embodiments to use not the right-most state but the next to the right-most state for representing a "0" in a control information bit. The probability of a cell being written into a state that is not the right-most state, such as the next to the right-most state, to become over programmed is significantly less than the probability of a cell being written into the right-most state to become over programmed. Therefore this modification of the previous embodiments improves the reliability of the control information.

When applying this modification to the previous methods one should modify the writing and reading procedures provided above to reflect the fact that a "0" is now represented by a different state and a different bits combination, but these modifications are straight forward, and the basic principles of the above methods still apply.

One might argue that this embodiment, while reducing the probability of errors caused by over programming, increases the probability of errors caused by charge leakage from the floating gate, as it reduces the distance separating the two states used for encoding control information bits. It might be the case that the gain is smaller than the loss. However, this might be true only for two-bits MBC devices, where moving from the right-most state to its neighboring state results in a relatively large and noticeable change in the cell's threshold voltage. But when applying this embodiment to three-bits MBC and even more so to four-bits MBC devices, the change in distance between the two neighboring states is much smaller, and consequently the increase in the probability of errors caused by storage leakage is also much smaller and usually even negligible. Thus, in such devices the advantage offered by this embodiment far outweighs any disadvantage of increased leakage errors.

As noted for the first embodiment, it should be understood that the methods of the second and third embodiments are also not limited to the two-bit MBC case and are equally applicable to any MBC device for both the second and third embodiments. Similarly, the methods of the second and third embodiments can also be extended to the case where the control information is stored with more than one bit in a cell.

Figure 2:
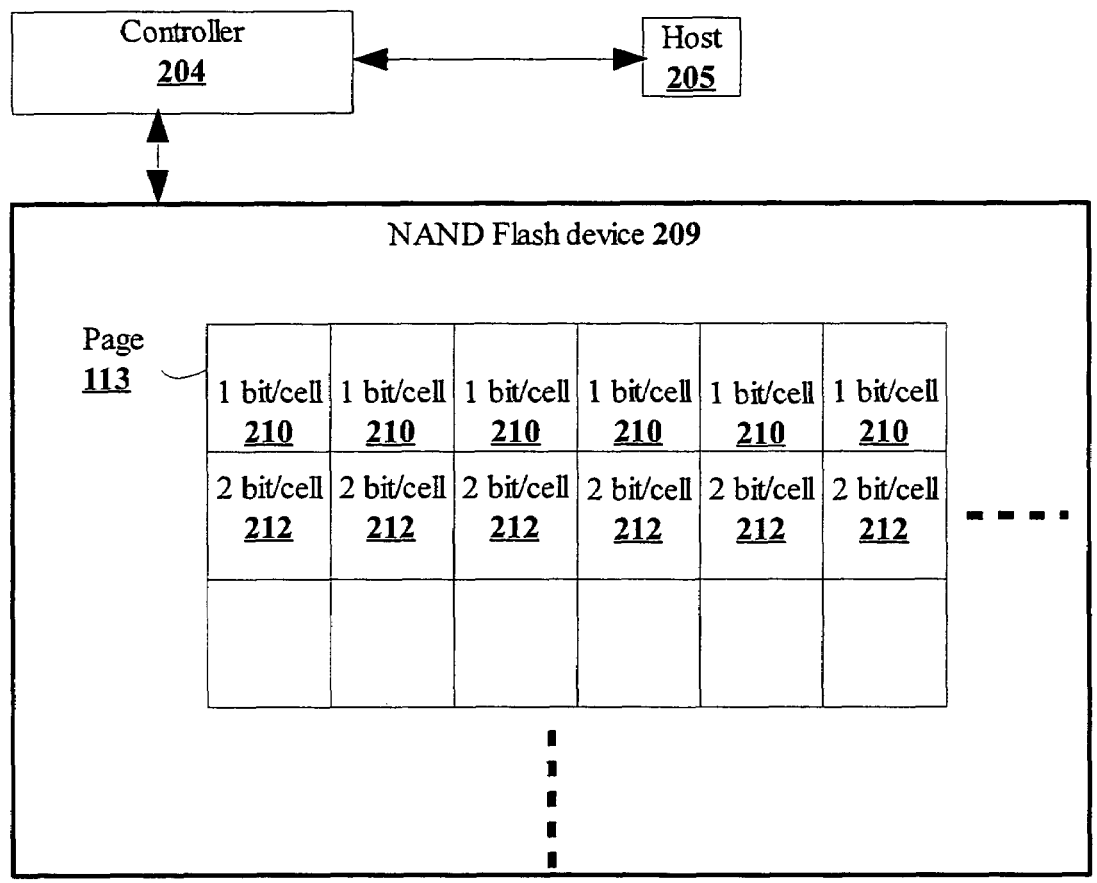
FIG. 2 is a simplified drawing of a flash device, according to an embodiment of the present invention.

Referring now to the drawings, FIG. 2 illustrates, a system 20 including a NAND flash device 209. Flash device 209, controlled by controller 204 is attached to host 205. A page 113 of memory of flash device 209 is shown, page 113 includes memory cells 210 with 1 bit/cell and memory cells 212 with 2 bits/cell.

Figure 3:
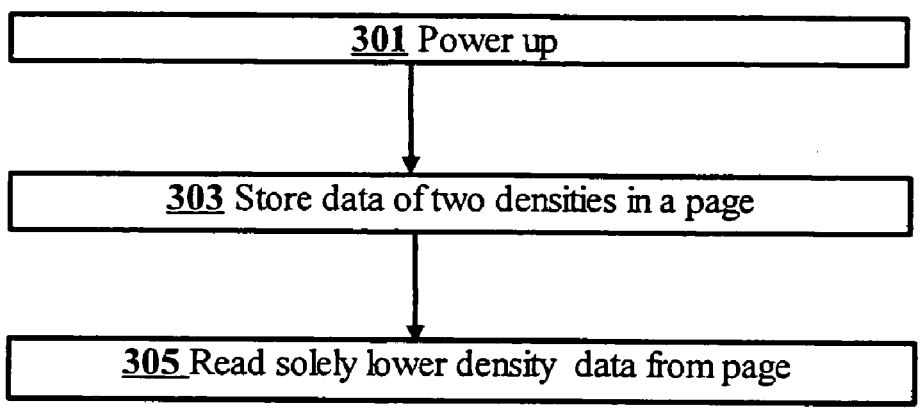
FIG. 3 is a flow diagram according to an embodiment of the present invention.

FIG. 3 is a flow diagram of a process, according to an embodiment of the present invention. After power up (step 301) of NAND flash device 209, data is stored in two densities in page 113, for instance with control data stored in memory cells 210 of 1 bit/cell and user data stored in memory cells 212 of 2 bits/cell. After the data is stored (step 303) at the same time with two densities, a read command is provided (step 305) by controller 204 which is operative to read only the data stored in lower density, i.e. memory cells 210.

Therefore, the foregoing is considered as illustrative only of the principles of the invention. Further, since numerous modifications and changes will readily occur to those skilled in the art, it is not desired to limit the invention to the exact design and operation shown and described, and accordingly, all suitable modifications and equivalents may be resorted to, falling within the scope of the invention.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

While the invention has been described with respect to a limited number of embodiments, it will be appreciated that many variations, modifications and other applications of the invention may be made.

What is claimed is:

1. A method of storing data, the method comprising the steps of:
   (a) providing a flash memory device including a single flash memory die including a plurality of memory cells, wherein each of said memory cells is capable of storing a plurality of data bits;
   (b) storing first data bits into at least one of said memory cells, said at least one memory cell allocated to at least one page and said at least one memory cell used for storing M bits per cell; and
   (c) storing second data bits into at least one other of said memory cells, said at least one other cell allocated to said at least one page, and said at least one other memory cell used for storing N bits per cell;
   wherein said storing first data bits and said storing second data bits are performed at the same time using the same at least one writing operation, wherein N is less than M.

2. The method, according to claim 1, wherein said first data bits are user data bits.

3. The method, according to claim 1, wherein said second data bits are control data bits.

4. The method, according to claim 1, wherein N is selected from the group of integers consisting of one and two.

5. The method, according to claim 1, wherein N equals one, and wherein M equals an integer selected from the group of integers consisting of two, three and four.

6. The method, according to claim 1, wherein N equals two and wherein M equals an integer selected from the group of integers consisting of three and four.

7. The method, according to claim 1, wherein said at least one writing operation is executed with a single write command.

8. The method, according to claim 1, further comprising the step of:
   (d) reading said at least one memory cell and said at least one other memory cell in a single read operation, wherein said reading reads at least one of said first data bits and at least one of said second data bits.

9. The method, according to claim 1, further comprising the step of:
   (d) reading said at least one other memory cell in a single read operation, wherein said reading reads at least one of said second data bits.

10. The method, according to claim 1, wherein said at least one other memory cell uses an available voltage state of largest voltage.

11. The method, according to claim 1, wherein said at least one other memory cell uses an available voltage state other than the voltage state of largest voltage used by said at least one memory cell.

12. The method, according to claim 1, wherein said at least one other memory cell uses an available voltage state of second largest voltage.

13. The method, according to claim 1, wherein said flash memory device is a NAND flash memory device.

14. A method of reading stored data, the method comprising the steps of:
   (a) providing a flash memory device including a single flash memory die including a plurality of memory cells, wherein each of said memory cells is capable of storing M data bits, wherein M is an integer greater than one; and
   b) reading in a single command a single bit respectively from each of said memory cells of a page, wherein said single bit read from one of said memory cells is valid only when less than M bits are stored in said one memory cell.

15. A method of reading stored data, the method comprising the steps of:
   (a) providing a flash memory device including a single flash memory die including a plurality of memory cells, wherein each of said memory cells is capable of storing M data bits, wherein M is an integer greater than one; and
   (b) providing a read command for reading a group of said cells, wherein said read command always performs a single voltage comparison on each said memory cell of said group.

16. The method, according to claim 14, wherein M is an integer selected from the group consisting of two, three and four.

17. A flash memory device comprising:
   (a) a plurality of memory cells in a single flash memory die, wherein each of said memory cells is capable of storing a plurality of data bits; and
   (b) a controller which stores first data bits in at least one of said memory cells said at least one cell storing M bits per cell; and second data bits in at least one other of said memory cells, said at least one other cell storing N bits per cell; wherein said at least one memory cell is allocated to at least one page, wherein said at least one other cell is allocated to said at least one page, wherein the same at least one writing operation is used for storing at the same time M bits per cell in at least one of said memory cells and N bits per cell in at least one of said other memory cells, wherein N is less than M.

18. The flash memory device, according to claim 17, wherein said first data bits are user data bits.

19. The flash memory device, according to claim 17, wherein said second data bits are control data bits.

20. The flash memory device, according to claim 17, wherein N is selected from the group of integers consisting of one and two.

21. The flash memory device, according to claim 17, wherein N equals one, and wherein M equals an integer selected from the group of integers consisting of two, three and four.

22. The flash memory device, according to claim 17, wherein N equals two and wherein M equals an integer selected from the group of integers consisting of three and four.

23. The flash memory device, according to claim 17, wherein said at least one writing operation is executed with a single write command.

24. The flash memory device, according to claim 17, wherein said controller reads at least one of said second data bits with a single read operation.

25. The flash memory device, according to claim 17, wherein said controller stores at least one said second data bits using an available voltage state of largest voltage.

26. The flash memory device, according to claim 17, wherein said at least one other memory cell uses an available voltage state other than the voltage state of largest voltage used by said at least one memory cell.

27. A flash memory device comprising:
   (a) a plurality of memory cells in a single flash memory die, wherein each of said memory cells is capable of storing M data bits, wherein M is an integer greater than one; and
   b) a mechanism for reading in a single command a single bit respectively from any of said memory cells of a page, wherein said single bit read from one of said memory cells is valid only when less than M bits are stored in said one memory cell.

28. The flash memory device, according to claim 27, wherein M is an integer selected from the group consisting of two, three and four.

29. A flash memory device comprising:
   (a) a plurality of memory cells in a single flash memory die, wherein each of said memory cells is capable of storing M data bits, wherein M is an integer greater than one; and
   (b) a mechanism for providing a read command for reading a group of said cells wherein said read command always performs a single voltage comparison on each said memory cell of said group.

30. The flash memory device, according to claim 29, wherein M is an integer selected from the group consisting of two, tree and four.

31. A method of storing data, the method comprising the steps of
   (a) providing a flash memory device including a single flash die including a plurality of memory cells, wherein each of said memory cells is capable of being put into any one of a plurality of cell states;
   (b) storing first data bits into at least one of said memory cells, said at least one memory cell allocated to at least one page, and said storing first data bits making use of M of said plurality of cell states;
   (c) storing second data bits into at least one other of said memory cells, said at least one other memory cell allocated to said at least one page, and said storing second data bits making use of N of said plurality of cell states; and
   wherein said storing first data bits and said storing second data bits is performed at the same time using the same at least one writing operation, and wherein N is less than M.

* * * * *

UNITED STATES PATENT AND TRADEMARK OFFICE
CERTIFICATE OF CORRECTION

PATENT NO. : 7,308,525 B2  Page 1 of 1
APPLICATION NO. : 11/090177
DATED : December 11, 2007
INVENTOR(S) : Menahem Lasser and Mark Murin It is certified that error appears in the above-identified patent and that said Letters Patent is hereby corrected as shown below:

Front page

Title should be corrected as follows: change "reliablility" to "reliability"

Claim 17 (b), column 15, Line 37, insert a comma between "cells" and "said"

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,308,525 B2  Page 1 of 1
APPLICATION NO. : 11/090177
DATED : December 11, 2007
INVENTOR(S) : Menahem Lasser and Mark Murin It is certified that error appears in the above-identified patent and that said Letters Patent is hereby corrected as shown below:

Title page Item [54] and Column 1, line 3

Title should be corrected as follows: change "reliablility" to "reliability"

Claim 17 (b), column 15, Line 37, insert a comma between "cells" and "said"

This certificate supersedes the Certificate of Correction issued May 20, 2008.

Signed and Sealed this

Seventeenth Day of June, 2008

JON W. DUDAS
*Director of the United States Patent and Trademark Office*